(12) United States Patent
Halpin

(10) Patent No.: US 6,929,299 B2
(45) Date of Patent: Aug. 16, 2005

(54) BONDED STRUCTURES FOR USE IN SEMICONDUCTOR PROCESSING ENVIRONMENTS

(75) Inventor: Michael W. Halpin, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 117 days.

(21) Appl. No.: 10/225,545

(22) Filed: Aug. 20, 2002

(65) Prior Publication Data

US 2005/0088003 A1   Apr. 28, 2005

(51) Int. Cl.[7] .................................................. B25J 15/06
(52) U.S. Cl. ...................... 294/64.3; 294/1.1; 414/941
(58) Field of Search ............................ 294/1.1, 64.1, 294/64.2, 64.3, 49, 55; 414/737, 752.1, 941; 901/40, 28

(56) References Cited

U.S. PATENT DOCUMENTS

| | | | | |
|---|---|---|---|---|
| 821,847 | A | * | 5/1906 | Arnavat ........................ 294/57 |
| 1,211,655 | A | * | 1/1917 | Adams et al. ............... 172/380 |
| 4,911,743 | A | | 3/1990 | Bagby |
| 5,324,155 | A | * | 6/1994 | Goodwin et al. ......... 414/744.5 |
| 5,746,460 | A | | 5/1998 | Marohl et al. |
| 6,116,848 | A | | 9/2000 | Thomas et al. |
| 6,183,183 | B1 | | 2/2001 | Goodwin et al. |
| 6,244,641 | B1 | * | 6/2001 | Szapucki et al. ........... 294/64.1 |
| 6,499,777 | B1 | * | 12/2002 | Wang .......................... 294/1.1 |

* cited by examiner

Primary Examiner—Dean J. Kramer
(74) Attorney, Agent, or Firm—Knobbe Martens Olson & Bear LLP

(57) ABSTRACT

A structure for use in a semiconductor processing environment is provided, including a first plate a second plate bonded to the first plate. A distal end of the second plate extends beyond a distal end of the first plate. The distal end of the first plate is tapered along a length at least one-half of a width of the first plate adjacent the tapered distal end of the first plate.

26 Claims, 8 Drawing Sheets

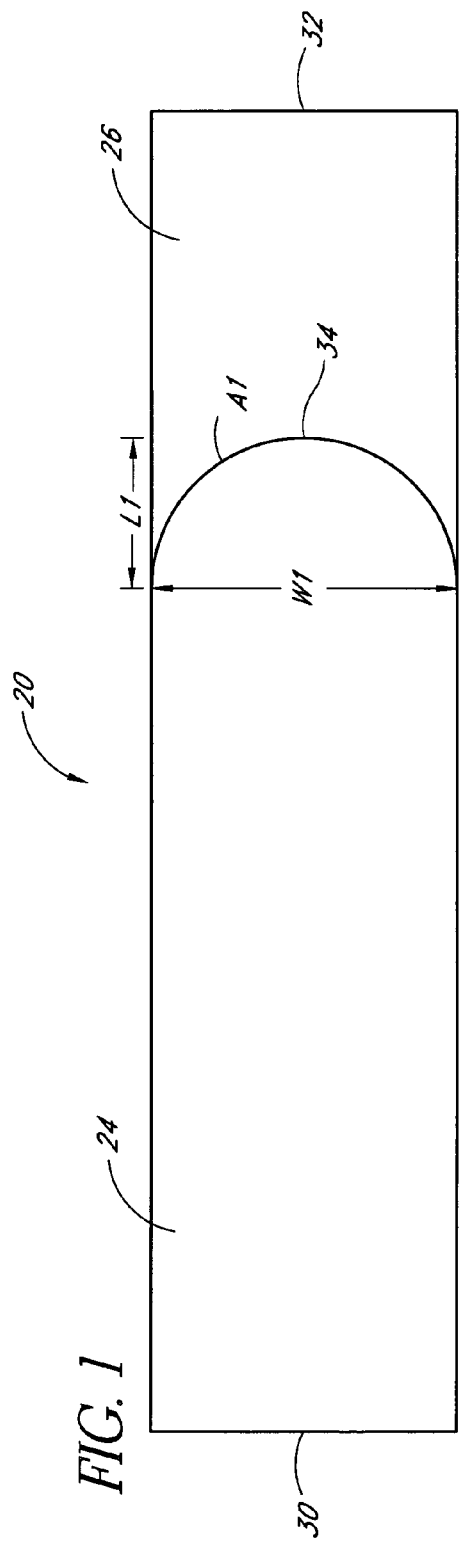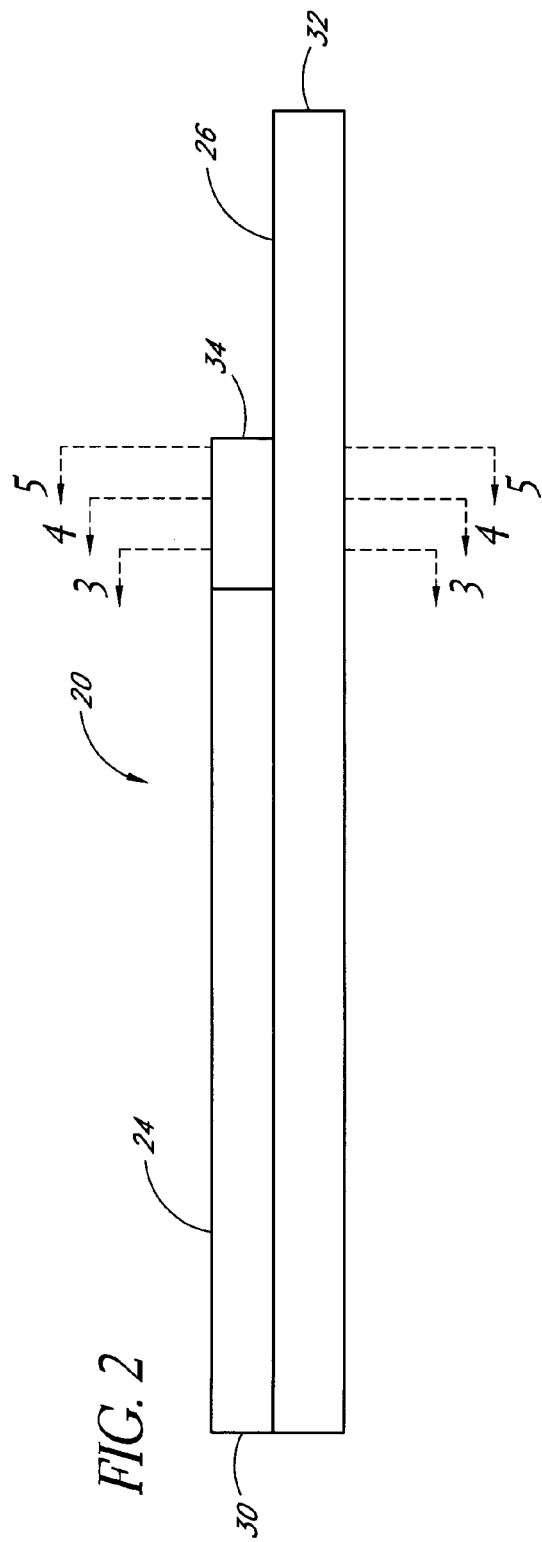

BONDED STRUCTURES FOR USE IN SEMICONDUCTOR PROCESSING ENVIRONMENTS

FIELD OF THE INVENTION

The present invention relates to bonded structures for use in semiconductor processing environments and, more particularly, to increased strength bonded structures for use in such environments.

BACKGROUND OF THE INVENTION

In the manufacture of integrated circuits, semiconductor devices are formed on wafers of semiconductor material. Some of the processes used in the formation of semiconductor devices, such as chemical vapor deposition (CVD) processes, involve positioning the wafers in high temperature process chambers where the wafers are exposed to reactive gases to selectively form layers on the wafers.

The structures exposed to the high temperatures involved in semiconductor processing must be constructed from materials that can withstand the high temperatures. For example, robotic end-effectors, which are commonly used to transport wafers between high temperature process chambers, are often fabricated from quartz or ceramic materials. Such materials, although able to withstand the high temperatures involved in semiconductor processing, are typically brittle, and the structures of which they are made are often relatively fragile.

End-effectors, for example, are often broken during packaging, transportation and use. Many such end-effectors are formed of several plate-like layers which overlap one another and are bonded together. When the end-effectors are subjected to bending loads during packaging, transportation, or use, the end-effectors tend to fail at the edges or ends of the layers, where the cross-sectional area of the end-effector changes abruptly. Stress concentrations develop at these abrupt changes in cross-sectional area, causing the end-effectors to break at the stress concentrations when bending loads are applied.

SUMMARY OF THE INVENTION

Accordingly, a need exists for increased strength bonded structures for use in semiconductor processing environments that are less susceptible to breakage.

In accordance with one aspect of the present invention, a structure for use in a semiconductor processing environment is provided, comprising a first quartz or ceraminc plate and a second quartz or ceramic plate bonded to the first plate. A distal end of the second plate extends beyond a distal end of the first plate. The distal end of the first plate is tapered along a length at least one-half of a width of the first plate adjacent the tapered distal end of the first plate.

In accordance with another aspect of the present invention, a structure for use in a semiconductor processing environment is provided, comprising a first elongated plate and a second elongated plate bonded to the first plate. A distal end of the second plate extends beyond a distal end of the first plate. A cross-sectional area of the first plate gradually decreases towards the distal end of the first plate along a length at least one-half of a width of the first plate adjacent the distal end of the first plate.

In accordance with another aspect of the present invention, a structure for transporting a semiconductor wafer is provided, comprising an arm portion having a distal end, and a head portion having a curved proximal edge. The distal end of the arm portion overlaps and is bonded to the head portion. The proximal edge of the head portion extends across a surface of the arm portion.

In accordance with another aspect of the present invention, a structure for transporting a semiconductor wafer is provided, comprising an elongated arm portion and a head portion. The arm portion includes a lower plate and an upper plate bonded to the lower plate. A distal end of the lower plate extends beyond a distal end of the upper plate. The head portion is bonded to the lower plate and has a proximal edge that extends across a surface of the lower plate. At least one of the distal end of the upper plate and the proximal edge of the head portion are tapered.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

FIG. 1 is a schematic top plan view of an exemplary bonded structure having certain features and advantages in accordance with the present invention;

FIG. 2 is a schematic side elevational view of the structure of FIG. 1;

DETAILED DESCRIPTION OF THE PREFERRED EMBODIMENTS

Figure 3:
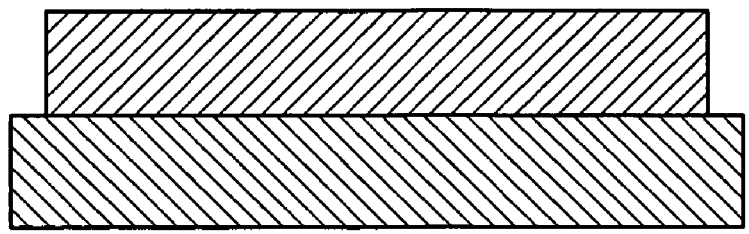
FIG. 3 is a cross-sectional view of the structure of FIG. 1 taken along the plane 3—3 of FIG. 2.
Figure 4:
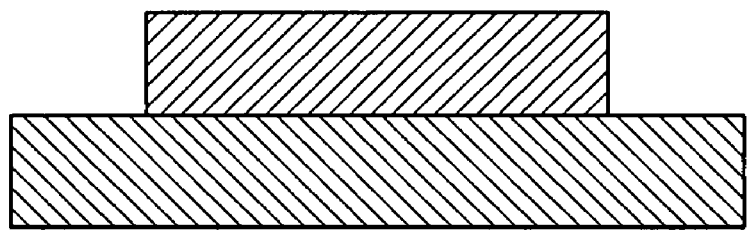
FIG. 4 is a cross-sectional view of the structure of FIG. 1 taken along the plane 4—4 of FIG. 2.
Figure 5:
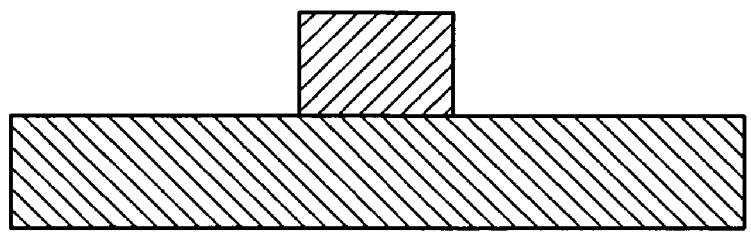
FIG. 5 is a cross-sectional view of the structure of FIG. 1 taken along the plane 5—5 of FIG. 2.

With reference to FIGS. 1 and 2, a structure 20 is provided for use in a semiconductor processing environment, including a first plate 24 and a second plate 26 bonded to the first plate 24. The first and second plates 24, 26 may comprise quartz or a ceramic material suitable for use in the processing environment. The proximal end 30 of the first plate 24 may be adapted to be connected to an object within the processing environment, such as a robot arm (not shown). The distal end 32 of the second plate 26 extends beyond the distal end 34 of the first plate 24.

The distal end 34 of the first plate 24 is tapered towards the distal end 32 of the second plate 26. Preferably, as illustrated in FIG. 1, the distal end 34 of the first plate 24 is tapered along a length L1 at least one-half of the width W1 of the first plate 24 adjacent the tapered distal end 34 of the first plate 24. More preferably, the distal end 34 of the first plate 24 is curved towards the distal end 32 of the second plate 26 along a generally circular arc A1 having a diameter approximately equal to the width W1 of the first plate 24 adjacent the tapered distal end 34. Alternatively, however, the distal end 34 of the first plate 24 may have a parabolic or other tapered shape.

The tapering of the distal end 34 of the first plate 24 minimizes stress concentrations along the structure 20 when a bending load is applied to the structure 20. Although the total thickness of the structure 20 decreases abruptly at the distal end 34 of the first plate 24, the cross-sectional area of the structure 20 taken in a transverse plane perpendicular to the plane of the structure 20 decreases only gradually as the width of the first plate 24 decreases towards the distal end 34. For example, as illustrated in FIGS. 2–5, the area of a cross-section of the structure 20 taken in the plane 3—3 is somewhat greater than the area of a cross-section taken in the plane 4—4 which, in turn, is somewhat greater than the area of a cross-section taken in the plane 5—5. As a result, stress concentrations at the distal end 34 of the first plate 24 are minimized, thereby reducing the likelihood of failure of the structure 20 at the distal end 34.

It is to be understood that the bonded structure 20 illustrated in FIGS. 1–5 is merely exemplary. Those skilled in the art will recognize that a number of structures used in semiconductor processing may be constructed or modified in accordance with the present invention, particularly quartz or ceramic structures. Such structures include, but are not limited to, robot end-effectors (e.g., Bernoulli wands, paddles, spatulas, vacuum wands, etc.) and other structures used in semiconductor processing that are commonly subjected to bending loads.

Figure 6:
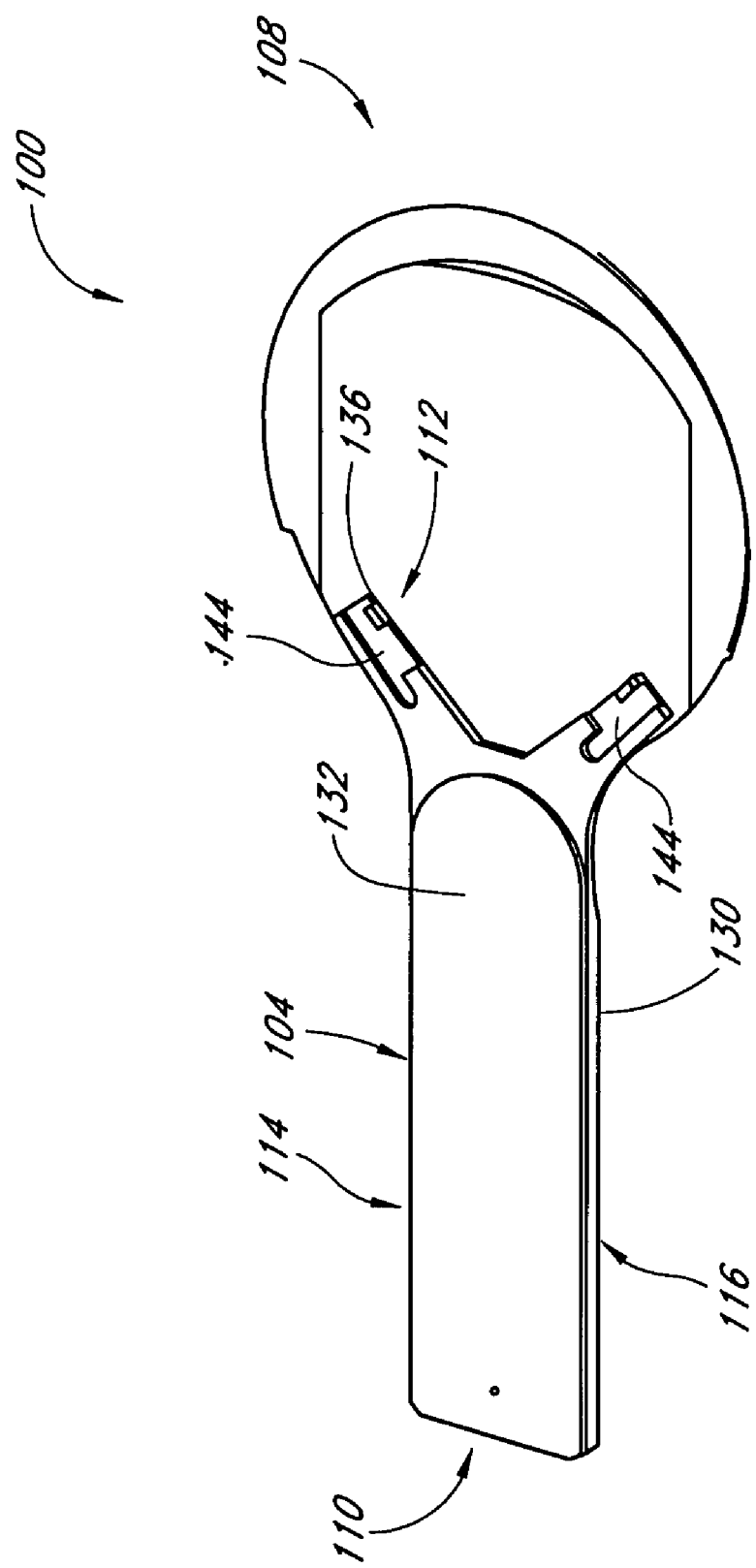
FIG. 6 is a perspective view of one embodiment of an end-effector having certain features and advantages in accordance with the present invention.

One embodiment of an end-effector 100 having features in accordance with the present invention is illustrated in FIGS. 6–11. In the embodiment shown, the end-effector 100 is a Bernoulli-type end-effector. As illustrated in FIG. 6, the end-effector 100 of the illustrated embodiment comprises an elongated arm portion 104 including an upper plate 132 and a lower plate 130, and a generally disc-shaped head portion 108. The arm portion 104 has a proximal end 110, a distal end 112, a first side 114 and a second side 116. The proximal end 110 of the arm portion 104 is adapted to be connected to a robot (not shown). As is well known in the art, the robot may be programmed to move the end-effector 100 in a predetermined manner to transport the semiconductor wafers within a wafer processing environment. The end-effector 100 preferably is fabricated from a material suitable for the high temperature processing environment in which the end-effector 100 is to be employed, such as quartz or a ceramic material. In the illustrated embodiment, the end-effector 100 is regularly subjected to temperatures in excess of 600° C., and often greater than 800° C.

Figure 7:
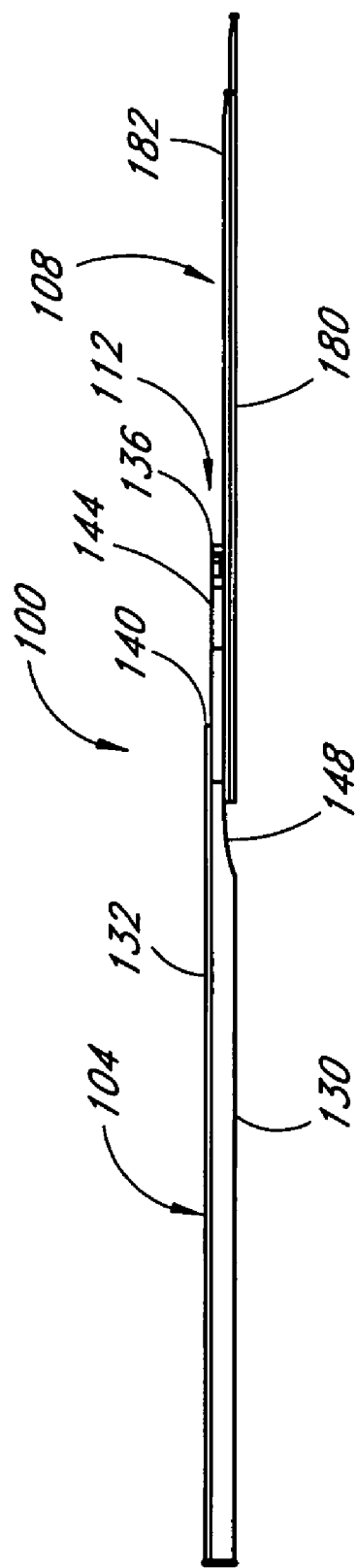
FIG. 7 is a side elevational view of the end-effector of FIG. 6.

With reference to FIG. 7, in the embodiment shown, the upper plate 132 of the arm portion 104 overlaps the lower plate 130. The lower plate 130 is longer than the upper plate 132, so that a distal end 136 of the lower plate 130 extends beyond a distal end 140 of the upper plate 132. A recessed area 148 is provided beneath the distal end 136 of the lower plate 130. The thickness of the lower plate 130 is thus reduced at the distal end 136. In the illustrated embodiment, a pair of fingers 144 are provided at the distal end 136 of the lower plate 130 (see also FIG. 6).

Figure 8:
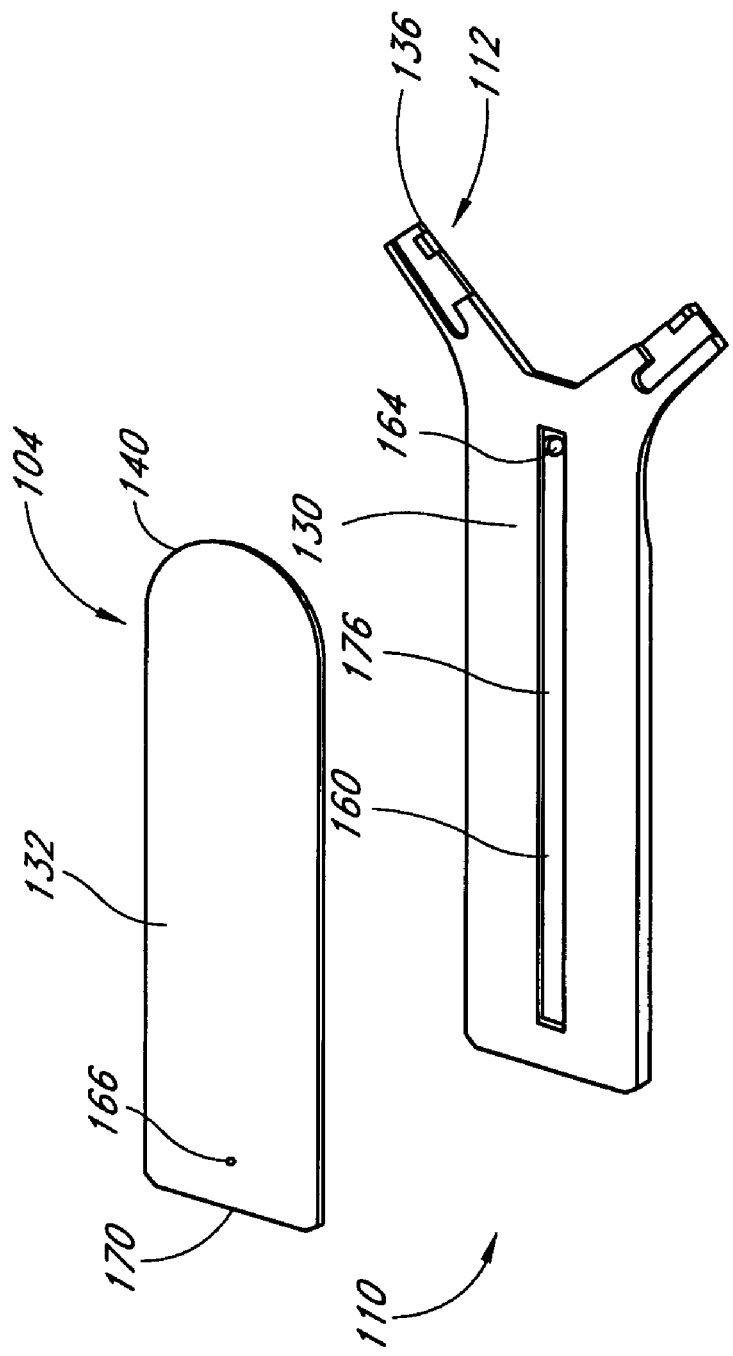
FIG. 8 is an exploded perspective view of the arm portion of the end-effector of FIG. 3.

With reference to FIG. 8, a longitudinal groove 160 preferably is formed in at least one of the facing surfaces of the upper and lower plates 132, 130. In the embodiment shown, the groove 160 is formed in the lower plate 130. A first opening 164 is provided through the lower plate 130 at a distal end of the groove 160. A second opening 166 is provided through the upper plate 132 at a proximal end 170 of the upper plate 132. When the upper and lower plates 132, 130 are bonded together, as described below, the groove 160 forms a gas passage 176 extending along the arm portion 104 between the upper and lower plates 132, 130.

Figure 9:
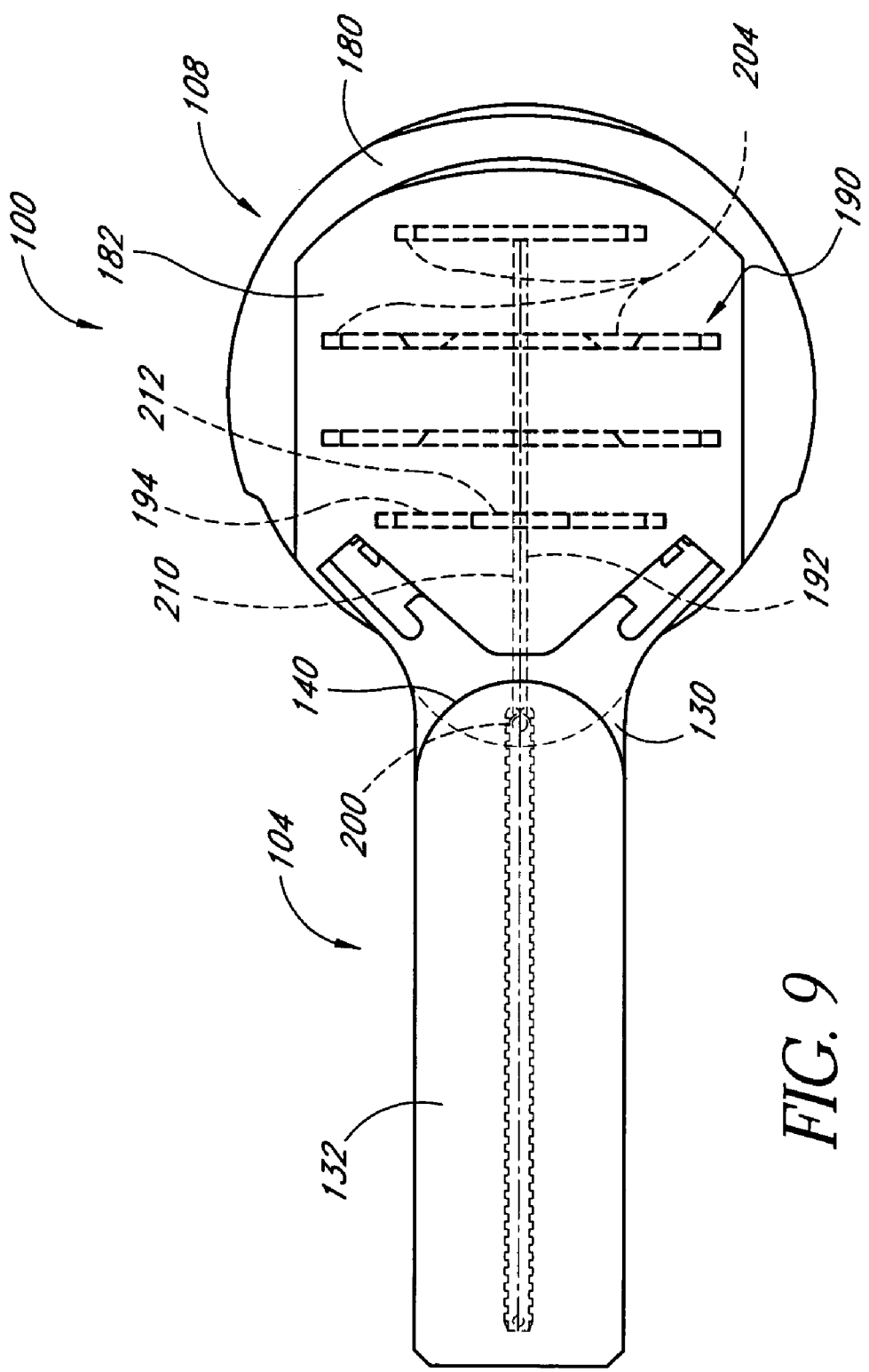
FIG. 9 is a top plan view of the end-effector of FIG. 6.

With reference again to FIG. 7, in the illustrated embodiment, the head portion 108 of the end-effector 100 comprises a bottom plate 180 and a top plate 182 overlapping the bottom plate 180. As illustrated in FIG. 9, the bottom plate 180 is larger than the top plate 182 and extends laterally and distally beyond the top plate 182. A plurality of grooves 190 preferably are formed in at least one of the facing surfaces of the top and bottom plates 182, 180. In the embodiment shown, the grooves 190 are formed in the bottom plate 180. A main groove 192 extends longitudinally along the center of the bottom plate 180, and a plurality of branch grooves 194 extend laterally from the main groove 192. An opening 200 is provided through the top plate 182 at a proximal end of the main groove 192. Openings 204 are further provided through the bottom plate 180 at various locations along the branch grooves 194. When the top and bottom plates 182, 180 are bonded together, as described below, the main groove 192 forms a main gas passage 210 and the branch grooves 194 form branch passages 212 extending along the head portion 108 between the top and bottom plates 182, 180.

Figure 10:
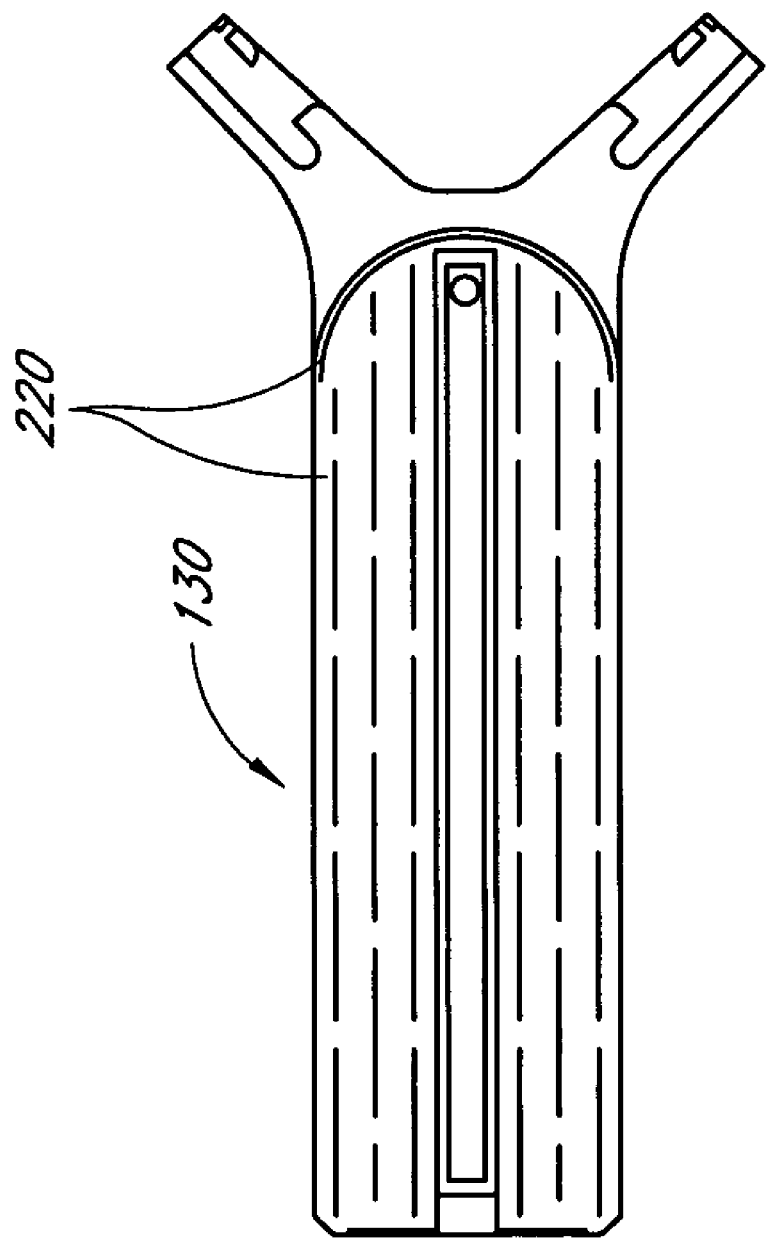
FIG. 10 is a top plan view of the lower plate of the arm portion of FIG. 8 illustrating a preferred pattern for the bonding material applied between the upper plate and the lower plate of the arm portion of the end-effector.

The upper and lower plates 132, 130 of the arm portion 108 are preferably bonded together with a suitable bonding material, such as an adhesive glass frit material. One preferred glass frit material is available from Corning, Inc. as product number 691045-7070-000. The bonding material has a melting temperature less than the melting temperature of the material or materials from which the upper and lower plates 132, 130 are made. The bonding material may be applied to one or both of the upper and lower plates 132, 130, and is preferably applied through a silkscreen (not shown) in a predetermined pattern. In the illustrated embodiment, the bonding material is applied to the lower plate 130 in a broken line pattern 220, as illustrated in FIG. 10, to prevent air from being trapped and creating air pockets between the upper and lower plates 132, 130 during bonding. The upper plate 132 is then positioned on top of the lower plate 130, and the arm portion 104 is heated to a temperature sufficient to melt the bonding material (but below the melting temperature of the upper and lower plates 132, 130) and subsequently cooled to bond the plates 132, 130 together.

The top and bottom plates 182, 180 of the head portion 108 may be bonded together in a similar manner. Bonding material may be applied through a silkscreen (not shown) to one or both of the upper and lower plates 182, 180 of the head portion 108. The top plate 182 is then positioned on the bottom plate 180, and the head portion 108 is heated to a temperature sufficient to melt the bonding material and then cooled to bond the plates 182, 180 together.

Figure 11:
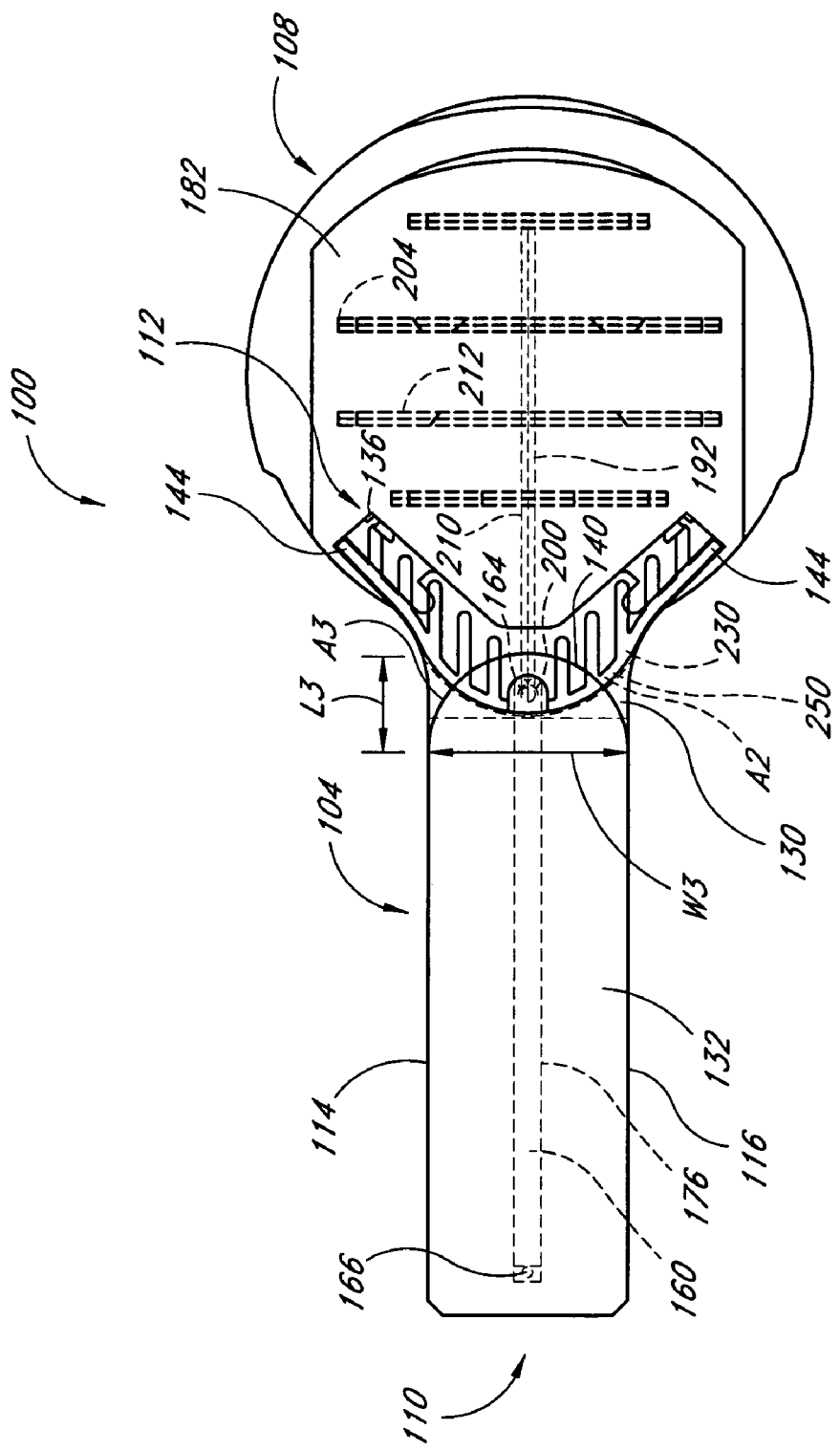
FIG. 11 is a top plan view of the end-effector of FIG. 6 illustrating a preferred bonding line pattern for the bonding material between the arm portion and the head portion of the end-effector.

With reference now to FIG. 11, the distal end 112 of the arm portion 104 is similarly bonded to the head portion 108. In the illustrated embodiment, the lower plate 130 of the arm portion 104 is bonded to the top plate 182 of the head portion 108. Bonding material may be applied through a silkscreen (not shown) to one or both of the arm portion 104 and the head portion 108 in a predetermined pattern. One preferred bonding material pattern 230 is illustrated in FIG. 11. The distal end 112 of the arm portion 104 is then positioned over a proximal edge 250 of the head portion 108 so that the fingers 144 at the distal end 112 of the arm portion 104 extend along the peripheral surface of the head portion 108. The opening 164 at the distal end of the groove 160 in the arm portion 104 is aligned with the opening 200 at the proximal end of the main groove 192 in the head portion 108, thereby connecting the gas passage 176 of the arm portion 104 with the main gas passage 210 of the head portion 108. The end effector 100 is heated to a temperature sufficient to melt the bonding material and subsequently cooled to bond the arm portion 104 and the head portion 108 together.

As illustrated in FIG. 11, in the embodiment shown, the proximal edge 250 of the head portion 108 extends across the arm portion 104 from the first side 114 of the arm portion 104 to the second side 116. The proximal edge 250 of the head portion 108 is tapered towards the proximal end 110 of the arm portion 104. Preferably, as illustrated in FIG. 11, the proximal edge 250 of the head portion 108 extends along a generally circular arc A2. Alternatively, however, the proximal edge 250 of the head portion 108 may have a parabolic or other tapered shape. As illustrated in FIG. 11, some of the bonding material preferably is applied adjacent the tapered proximal edge 250 of the head portion 108 to ensure that the arm portion 104 and the head portion 108 are properly joined at the proximal edge 250.

Similarly, in the embodiment shown, the distal end 140 of the upper plate 132 of the arm portion 104 is tapered towards the distal end 136 of the lower plate 130 of the arm portion 104. Preferably, the distal end 140 of the upper plate 132 is tapered along a length L3 at least one-half of the width W3 of the upper plate 132 adjacent the tapered distal end 140. More preferably, as illustrated in FIG. 11, the distal end 140 of the upper plate 132 is curved along a generally circular arc A3 having a diameter approximately equal to the width W3 of the upper plate 132 adjacent the distal end 140. Alternatively, however, the distal end 140 of the upper plate 132 may have a parabolic or other tapered shape. Some of the bonding material preferably is applied adjacent the tapered distal end 140 of the upper plate 132 (see the bonding material pattern 220 illustrated in FIG. 10) to ensure that the upper plate 132 and lower plate 130 are properly joined at the distal end 140. In the embodiment shown, the proximal edge 250 of the head portion 108 and the distal end 140 of the upper plate 132 overlap one another.

In operation, a gas, such as nitrogen, is supplied to the end-effector 100 from a gas source (not shown). The gas enters the end-effector 100 through the opening 166 at the proximal end 110 of the arm portion 104, and flows through the gas passage 176 of the arm portion 104 to the gas passages 210, 212 of the head portion. The gas exits the end-effector 100 through the openings 204 from the branch passages 212. The robot to which the proximal end 110 of the arm portion 104 is connected moves the head portion 108 of the end-effector into position over the surface of a wafer (not shown). In accordance with the Bernoulli principle, the jets of gas exiting from the openings 204 in the branch passages 212 create a gas flow pattern above the wafer that causes the pressure immediately above the wafer to be less than the pressure immediately below the wafer. This pressure imbalance causes the wafer to experience an upward "lift" force. Moreover, as the wafer is drawn upwardly towards the end effector 100, the same jets that produce the lift force produce an increasingly larger repulsive force that substantially prevents the wafer from contacting the end-effector 100. As a result, it is possible to suspend the wafer below the end-effector 100 in a non-contacting manner.

When the proximal end 110 of the arm portion 104 is connected to the robot, a bending load is generated by the weight of the end-effector 100. The end-effector 100 may also be subjected to bending loads during packing and transportation. When a bending load is applied to the end-effector 100, stress concentrations develop along the length of the end-effector 100 at any abrupt changes in cross-sectional area.

In the illustrated embodiment, the tapering of the proximal edge 250 of the head portion 108 and of the distal end 140 of the upper plate 132 of the arm portion 104 serve to minimize stress concentrations along the end-effector 100 when bending loads are applied to the end-effector 100. Although the thickness of the end-effector 100 changes abruptly at the proximal edge 250 of the head portion 108 and at the distal end 140 of the upper plate 132 of the arm portion 104, the cross-sectional area of the end-effector 100 taken in a transverse plane perpendicular to the plane of the end-effector 100 changes only gradually with the width of the proximal edge 250 of the head portion 108 and the distal end 140 of the upper plate 132. Stress concentrations at the proximal edge 250 of the head portion 108 and at the distal end 140 of the upper plate 132 are minimized, thereby reducing the likelihood of failure of the end-effector 100 at the proximal edge 250 of the head portion 108 or the distal end 140 of the upper plate 132.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. It is further contemplated that various combinations and sub-combinations of the specific features and aspects of the embodiments may be made and still fall within the scope of the invention. Accordingly, it is intended that the scope of the present invention herein disclosed should not be limited by the particular disclosed embodiments described above, but should be determined only by a fair reading of the claims that follow.

What is claimed is:

1. A structure for transporting a semiconductor wafer, comprising an arm portion having a distal end, and a head portion having a curved proximal edge having a width substantially equal to a width of the arm portion, the distal end of the arm portion overlapping and being bonded to the head portion, the proximal edge of the head portion extending across a surface of the arm portion, and wherein the curved proximal edge has a width substantially equal to a width of the arm portion where the arm portion overlaps the proximal edge of the head portion, wherein the distal end of the arm portion is bonded to the head portion along a curved bonding line adjacent the proximal edge of the head portion.

2. The structure of claim 1, wherein the arm portion comprises a lower plate and an upper plate bonded to the lower plate.

3. A structure for transporting a semiconductor wafer, comprising an arm portion having a distal end, and a head portion having a curved proximal edge, the distal end of the arm portion overlapping and being bonded to the head portion, the proximal edge of the head portion extending across a surface of the arm portion, wherein the proximal edge of the head portion extends along a generally circular arc and the distal end of the arm portion is bonded to the head portion along a curved bonding line adjacent the proximal edge of the head portion, the arm portion comprising a lower plate bonded to an upper plate, wherein the upper plate has a curved distal end extending across the lower plate.

4. The structure of claim 3, wherein the distal end of the upper plate extends along a generally circular arc.

5. The structure of claim 4, wherein the generally circular arc has a diameter approximately equal to a width of the upper plate adjacent the tapered distal end of the upper plate.

6. The structure of claim 5, wherein the head portion is bonded to the lower plate of the arm portion.

7. The structure of claim 6, wherein the distal end of the upper plate overlaps the proximal edge of the head portion.

8. The structure of claim 7, wherein a groove is formed in at least one of the upper and lower plates, the first groove forming a first gas passage extending along the arm portion between the upper and lower plates.

9. The structure of claim 8, further comprising a wand portion, wherein the wand portion comprises a top plate and a bottom plate, at least one of the top and bottom plates having a plurality of grooves formed therein forming a second gas passage extending along the head portion between the top and bottom plates, the second gas passage being in fluid communication with the first gas passage.

10. A structure for transporting a semiconductor wafer, comprising an arm portion having a distal end, and a head portion having a curved proximal edge having a width substantially equal to a width of the arm portion, the distal end of the arm portion overlapping and being bonded to the head portion, the proximal edge of the head portion extending across a surface of the arm portion, and wherein the curved proximal edge has a width substantially equal to a width of the arm portion where the arm portion overlaps the proximal edge of the head portion, wherein the arm portion and the head portion comprise quartz.

11. A structure for transporting a semiconductor wafer, comprising an arm portion having a distal end, and a head portion having a curved proximal edge having a width substantially equal to a width of the arm portion, the distal end of the arm portion overlapping and being bonded to the head portion, the proximal edge of the head portion extending across a surface of the arm portion, and wherein the curved proximal edge has a width substantially equal to a width of the arm portion where the arm portion overlaps the proximal edge of the head portion, wherein the arm portion and the head portion comprise a ceramic material.

12. A structure for transporting a semiconductor wafer, comprising:
an elongated arm portion comprising a lower plate and an upper plate bonded to the lower plate, a distal end of the lower plate extending beyond a distal end of the upper plate; and
a head portion bonded to the lower plate, the head portion having a proximal edge extending across a surface of the lower plate, wherein the proximal edge has a width substantially equal to a width of the lower plate where the proximal edge extends across the surface of the lower plate, at least one of the distal end of the upper plate and the proximal edge of the head portion being tapered.

13. The structure of claim 12, wherein the proximal edge of the head portion extends along a generally circular arc.

14. The structure of claim 13, wherein the head portion is bonded to the lower plate with a bonding material provided adjacent the proximal edge of the head portion.

15. A structure for transporting a semiconductor wafer, comprising:
an elongated arm portion comprising a lower plate and an upper plate bonded to the lower plate, a distal end of the lower plate extending beyond a distal end of the upper plate, wherein the distal end of the upper plate is tapered along a length at least one-half of a width of the upper plate adjacent the tapered distal end; and
a head portion bonded to the lower plate, the head portion having a proximal edge extending across a surface of the lower plate, at least one of the distal end of the upper plate and the proximal edge of the head portion being tapered.

16. The structure of claim 15, wherein the upper plate is bonded to the lower plate with a bonding material provided adjacent the distal end of the upper plate.

17. The structure of claim 15, wherein the proximal edge of the head portion is curved along a generally parabolic arc.

18. A structure for transporting a semiconductor wafer, comprising:
an elongated arm portion comprising a lower plate and an upper plate bonded to the lower plate, a distal end of the lower plate extending beyond a distal end of the upper plate; and
a head portion bonded to the lower plate, the head portion having a proximal edge extending along a generally circular arc across a surface of the lower plate, at least one of the distal end of the upper plate and the proximal edge of the head portion being tapered, wherein the head portion is bonded to the lower plate with a bonding material provided adjacent the proximal edge of the head portion, wherein the bonding material has a melting temperature less than a melting temperature of the arm portion and the head portion.

19. The structure of claim 18, wherein the bonding material is an adhesive glass frit material.

20. A structure for transporting a semiconductor wafer, comprising:
an elongated arm portion comprising a lower plate and an upper plate bonded to the lower plate, a distal end of the lower plate extending beyond a distal end of the upper plate; and
a head portion bonded to the lower plate, the head portion having a proximal edge extending across a surface of the lower plate, at least one of the distal end of the upper plate and the proximal edge of the head portion being tapered, wherein the lower plate comprises a pair of fingers at the distal end thereof, the fingers extending along an upper surface of a wand portion and being bonded to the upper surface of the wand portion.

21. A structure for use in a semiconductor processing environment, comprising:
a first quartz or ceramic plate; and
a second quartz or ceramic plate bonded to the first plate, a distal end of the second plate extending beyond a distal end of the first plate, the distal end of the first plate being tapered along a length at least one-half of a width of the first plate adjacent the tapered distal end of the first plate, wherein the distal end of the first plate is curved towards the distal end of the second plate along a generally circular arc having a diameter approximately equal to a width of the first plate adjacent the distal end of the first plate.

22. The structure of claim 21, wherein a proximal end of the first plate is adapted to be connected to an object within the semiconductor processing environment.

23. The structure of claim 22, wherein the first plate and the second plate comprise quartz.

24. The structure of claim 22, wherein the first plate and the second plate comprise a ceramic material.

25. A structure for use in a semiconductor processing environment, comprising:
   a first elongated plate; and
   a second elongated plate bonded to the first plate, a distal end of the second plate extending beyond a distal end of the first plate, a cross-sectional area of the first plate taken in a transverse plane generally perpendicular to a plane of the first plate gradually decreasing towards the distal end of the first plate, wherein the cross-sectional area of the first plate decreases along a length at least one-half of a width of the first plate adjacent the distal end of the first plate, and wherein the distal end of the first plate is curved towards the distal end of the second plate along a generally circular arc having a diameter approximately equal to a width of the first plate adjacent the distal end of the first plate.

26. The structure of claim 25, wherein the cross-sectional area of the first plate decreases along a length at least one-half of a width of the first plate adjacent the distal end of the first plate.

* * * * *